United States Patent
Gupta et al.

(10) Patent No.: US 10,874,037 B1
(45) Date of Patent: Dec. 22, 2020

(54) POWER-MODULE ASSEMBLY WITH COOLING ARRANGEMENT

(71) Applicant: Ford Global Technologies, LLC, Dearborn, MI (US)

(72) Inventors: Man Prakash Gupta, Dearborn, MI (US); Michael W. Degner, Dearborn, MI (US); Edward Chan-Jiun Jih, Troy, MI (US); Alfredo R. Munoz, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/579,490

(22) Filed: Sep. 23, 2019

(51) Int. Cl.
*H05K 7/20* (2006.01)
*H01L 23/473* (2006.01)
(Continued)

(52) U.S. Cl.
CPC ....... *H05K 7/20927* (2013.01); *H01L 23/473* (2013.01); *H01L 25/115* (2013.01);
(Continued)

(58) Field of Classification Search
CPC .......... H05K 7/20927; H05K 7/20272; H05K 7/20872; H05K 7/20254; H05K 7/1432; H05K 7/20281; H05K 7/20327; H05K 7/2039; H05K 7/20509; H05K 7/2089; H05K 7/20218; H05K 7/20945; H05K 1/0204; H05K 7/1474; H05K 7/208; H01L 23/473; H01L 25/115; H01L 2924/00014; H01L 2924/00; H01L 2924/0002; H01L 2224/97; H01L 25/0657; H01L 2224/06181; H01L 23/34; H01L 23/367; H01L 23/3677; H01L 2924/13055; H01L 2225/06555; H01L 2225/06589;
(Continued)

(56) References Cited

U.S. PATENT DOCUMENTS

| 1,662,870 A * | 3/1928 | Stancliffe ............. | F28D 9/0037 165/166 |
| 5,392,849 A * | 2/1995 | Matsunaga ........... | F28D 9/0075 165/167 |

(Continued)

*Primary Examiner* — Binh B Tran
*Assistant Examiner* — Michael A Matey
(74) *Attorney, Agent, or Firm* — David Kelley; Brooks Kushman P.C.

(57) ABSTRACT

A power-module assembly includes a plurality of power modules each including a power stage having a substrate and a transistor-based switching arrangement supported on the substrate. The power modules are arranged in a stack that defines coolant chambers interleaved with the power stages and defines a pair of coolant-supply manifolds disposed on opposing sides of the stack and extending along a length of the stack. For each power module, the substrate defines a network of cooling channels connecting the supply manifolds to a corresponding one of the chambers. The network includes first channels each configured to receive coolant from the pair of coolant-supply manifolds, second channels substantially parallel to the first channels and each opening into the corresponding one of the chambers, and third channels crisscrossing the first and second channels to connect the first and second channels in fluid communication.

20 Claims, 9 Drawing Sheets

(51) Int. Cl.
*H01L 25/11* (2006.01)
*H02M 7/00* (2006.01)
*H02M 7/5387* (2007.01)
*H02P 27/06* (2006.01)
*B60K 6/28* (2007.10)
*B60L 58/26* (2019.01)
*B60L 50/60* (2019.01)

(52) U.S. Cl.
CPC ......... *H02M 7/003* (2013.01); *H02M 7/5387* (2013.01); *H05K 7/20272* (2013.01); *H05K 7/20872* (2013.01); *B60K 6/28* (2013.01); *B60L 50/60* (2019.02); *B60L 58/26* (2019.02); *B60Y 2200/91* (2013.01); *B60Y 2200/92* (2013.01); *B60Y 2306/05* (2013.01); *B60Y 2400/112* (2013.01); *H02P 27/06* (2013.01)

(58) Field of Classification Search
CPC ............ H01L 24/97; H01L 25/0652; H01L 2924/1431; H01L 2924/15153; H01L 21/76898; H01L 23/46; H01L 23/4012; H01L 25/117; H02M 7/003; H02M 7/5387; H02M 2001/007; H02M 1/084; B60L 50/60; B60L 58/26; B60K 6/28; B60Y 2200/91; B60Y 2200/92; B60Y 2306/05; B60Y 2400/112; H02P 27/06; F28F 3/12; F28F 13/02; F28F 3/046; F28F 9/0253; F28D 15/00; F28D 15/0266; F28D 2021/0028; F28D 2021/008; F28D 9/0043; F28D 9/0037; F28D 9/005; F28D 9/0056; F28D 9/0075
See application file for complete search history.

(56) References Cited

U.S. PATENT DOCUMENTS

| | | | | |
|---|---|---|---|---|
| 5,429,183 A * | 7/1995 | Hisamori | ............... | F28D 9/005 165/134.1 |
| 6,167,952 B1 * | 1/2001 | Downing | ............... | F28F 3/086 165/167 |
| 6,442,023 B2 * | 8/2002 | Cettour-Rose | ........ | H02M 7/003 361/690 |
| 6,536,516 B2 * | 3/2003 | Davies | ............... | F02M 31/20 165/170 |
| 6,542,365 B2 * | 4/2003 | Inoue | ............... | H01L 23/4006 165/80.4 |
| 6,942,018 B2 | 9/2005 | Goodson et al. | | |
| 6,959,492 B1 * | 11/2005 | Matsumoto | ........... | F28D 9/0075 29/890.039 |
| 7,245,493 B2 * | 7/2007 | Inagaki | ............... | H01L 23/4334 174/15.1 |
| 7,835,151 B2 | 11/2010 | Olesen | | |
| 7,940,526 B2 * | 5/2011 | Schulz-Harder | ...... | H01L 23/473 165/104.33 |
| 8,033,326 B2 * | 10/2011 | Dakhoul | ............... | F28F 3/086 165/167 |
| 8,120,914 B2 * | 2/2012 | Kajiura | ............... | F28F 3/025 165/104.33 |
| 9,781,867 B2 * | 10/2017 | Yonak | ............... | B60K 6/543 |
| 9,950,628 B2 | 4/2018 | Lei et al. | | |
| 10,405,466 B1 * | 9/2019 | Pradeepkumar | .... | H01L 23/4006 |
| 2003/0196451 A1 * | 10/2003 | Goldman | ............... | F28F 13/12 62/515 |
| 2005/0259402 A1 * | 11/2005 | Yasui | ............... | H05K 7/20927 361/716 |
| 2006/0068250 A1 * | 3/2006 | Bai | ............... | H01M 8/04029 429/413 |
| 2006/0096299 A1 * | 5/2006 | Mamitsu | ........... | H05K 7/20927 62/3.2 |
| 2006/0108098 A1 * | 5/2006 | Stevanovic | ........... | H01L 23/473 165/80.4 |
| 2007/0044952 A1 * | 3/2007 | Kuno | ............... | H01L 23/473 165/287 |
| 2008/0237847 A1 * | 10/2008 | Nakanishi | ............. | H01L 23/473 257/722 |
| 2008/0251909 A1 * | 10/2008 | Tokuyama | ............. | H01L 23/473 257/706 |
| 2009/0146293 A1 * | 6/2009 | Olesen | ............... | H01L 25/117 257/714 |
| 2009/0211977 A1 * | 8/2009 | Miller | ............... | F28D 9/0037 210/646 |
| 2010/0280136 A1 * | 11/2010 | Tonkovich | ........... | B01J 19/0093 518/706 |
| 2014/0339693 A1 * | 11/2014 | Hotta | ............... | H01L 27/0629 257/714 |
| 2015/0045459 A1 * | 2/2015 | Tonkovich | ............. | C07C 29/152 518/704 |
| 2016/0197367 A1 * | 7/2016 | Chikugo | ........... | H01M 8/04395 429/446 |
| 2016/0204486 A1 * | 7/2016 | Kenney | ............... | F28F 1/045 429/120 |
| 2016/0308481 A1 * | 10/2016 | Lei | ............... | B60L 50/60 |
| 2016/0309622 A1 * | 10/2016 | Lei | ............... | H05K 7/20927 |
| 2016/0309623 A1 * | 10/2016 | Lei | ............... | B60L 58/10 |
| 2016/0309624 A1 * | 10/2016 | Lei | ............... | F28F 9/0246 |
| 2017/0033704 A1 * | 2/2017 | Lei | ............... | H02M 7/003 |
| 2017/0259672 A1 * | 9/2017 | Lei | ............... | B60L 50/16 |
| 2017/0259691 A1 * | 9/2017 | Lei | ............... | H01M 10/625 |
| 2017/0346412 A1 * | 11/2017 | Lei | ............... | B60K 6/365 |
| 2018/0063989 A1 * | 3/2018 | Lei | ............... | H05K 7/20409 |
| 2018/0098459 A1 * | 4/2018 | Chainer | ............... | F28F 3/12 |
| 2019/0154346 A1 * | 5/2019 | Crawford | ............. | F28D 9/0093 |
| 2019/0335628 A1 * | 10/2019 | Lei | ............... | H05K 7/20927 |
| 2019/0366823 A1 * | 12/2019 | Pradeepkumar | ...... | H02M 7/003 |
| 2020/0006197 A1 * | 1/2020 | Hart | ............... | H01L 23/14 |
| 2020/0006820 A1 * | 1/2020 | Cha | ............... | H01M 10/6557 |
| 2020/0006822 A1 * | 1/2020 | Shisler | ............... | H01M 10/6554 |
| 2020/0100388 A1 * | 3/2020 | Hernandez-Toledo | ............... | H05K 7/20636 |

\* cited by examiner

POWER-MODULE ASSEMBLY WITH COOLING ARRANGEMENT

TECHNICAL FIELD

The present disclosure relates to power-module assemblies for an electric powertrain of a vehicle and more specifically to thermal management of the power-module assemblies.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert direct current coming from the battery into alternating current compatible with the electric machines. The power inverter may also act as a rectifier to convert alternating current from the electric machines to direct current compatible with the battery.

SUMMARY

According to one embodiment, a power-module assembly includes a plurality of power modules each including a power stage having a substrate and a transistor-based switching arrangement supported on the substrate. The power modules are arranged in a stack that defines coolant chambers interleaved with the power stages and defines a pair of coolant-supply manifolds disposed on opposing sides of the stack and extending along a length of the stack. For each power module, the substrate defines a network of cooling channels connecting the supply manifolds to a corresponding one of the chambers. The network includes first channels each configured to receive coolant from the pair of coolant-supply manifolds, second channels substantially parallel to the first channels and each opening into the corresponding one of the chambers, and third channels crisscrossing the first and second channels to connect the first and second channels in fluid communication.

According to another embodiment, a power-module assembly includes a plurality of power modules each including a power stage and a frame defining a pocket adjacent to the power stage and slots disposed on opposing sides of the power stage. The power modules are stacked in an array such that pockets adjacent to each other form coolant chambers interleaved with the power stages and such that slots adjacent to each other form coolant headers. Each of the power stages has at least one substrate including first channels each configured to receive coolant from an associated pair of coolant headers, second channels substantially parallel to the first channels and each opening into a corresponding one of the coolant chambers to provide coolant thereto, and third channels crisscrossing the first and second channels to connect the first and second channels in fluid communication.

According to yet another embodiment, a power-module assembly has a plurality of power modules arranged in a stack. Each power module includes a frame and a power stage supported in the frame. The power stage has a plurality of switches supported on a substrate and configured to transform direct current into alternating current. The substrate includes an outer plate having opposing first and second edges. The outer plate defines first microchannels recessed into a back of the outer plate and oriented to extend between the opposing edges and defining second microchannels completely through a thickness of the outer plate, oriented to extend between the opposing edges, and positioned between the first microchannels such that the first and second microchannels alternate along the outer plate. An interior plate has a front disposed against the back of the outer plate and defines third microchannels recessed into the front and oriented to crisscross the first and second microchannels such that the third microchannels connect the first and second microchannels in fluid communication.

BRIEF DESCRIPTION OF THE DRAWINGS

In FIG. 8, the shown coolant circuit (shown stippled) is not an actual structural component disposed within the assembly. Rather, the various structural features of the assembly define boundaries of the shown coolant circuit, which is void space.

In FIG. 10, the shown the coolant circuit (shown stippled) is not an actual structural component disposed within the assembly. Rather, the various structural features of the assembly define boundaries of the shown coolant circuit, which is void space.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
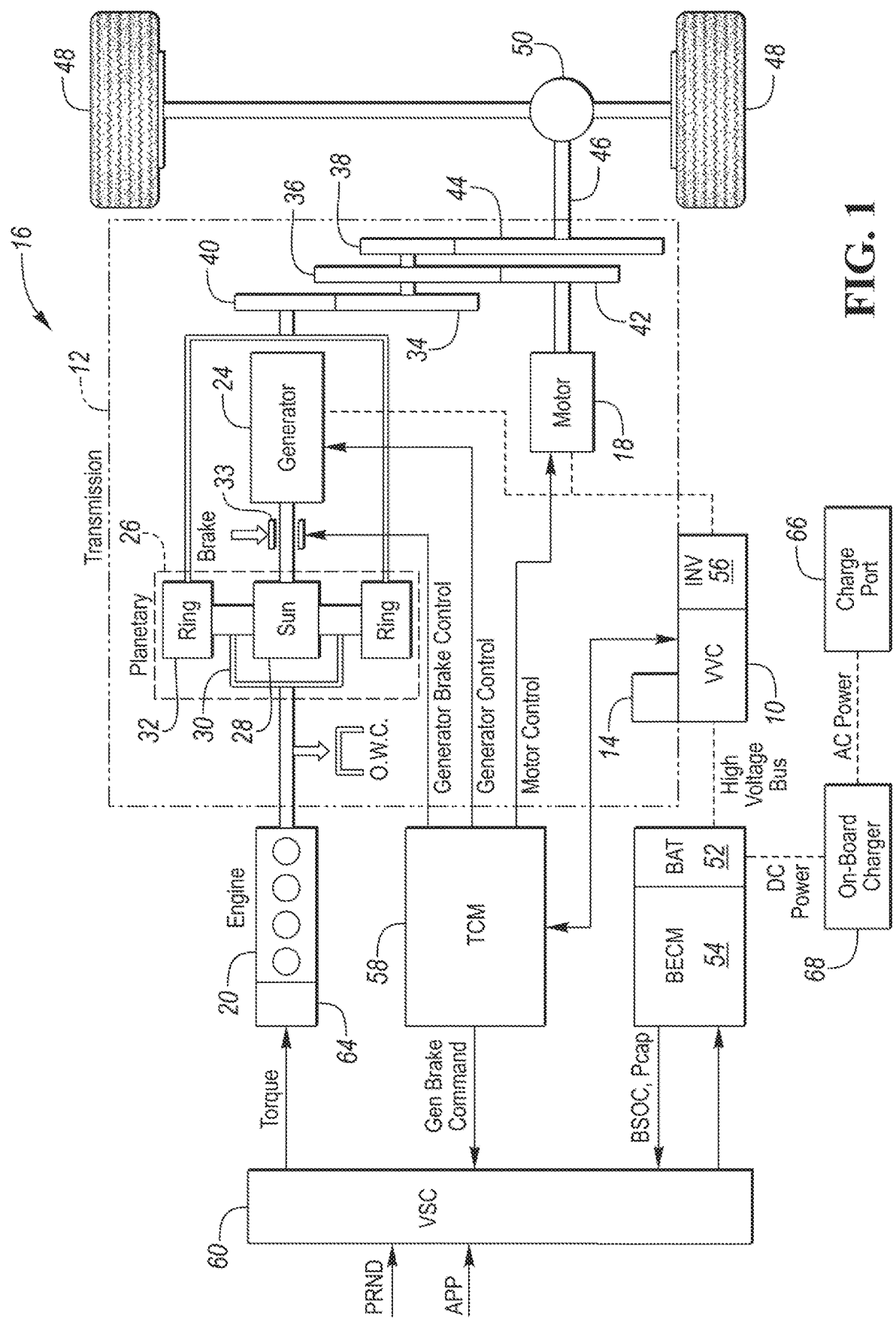
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable-voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one inverter associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV, a BEV, or a fuel-cell electric vehicle. Further, the shown PHEV architecture is merely one example embodiment.

Figure 2:
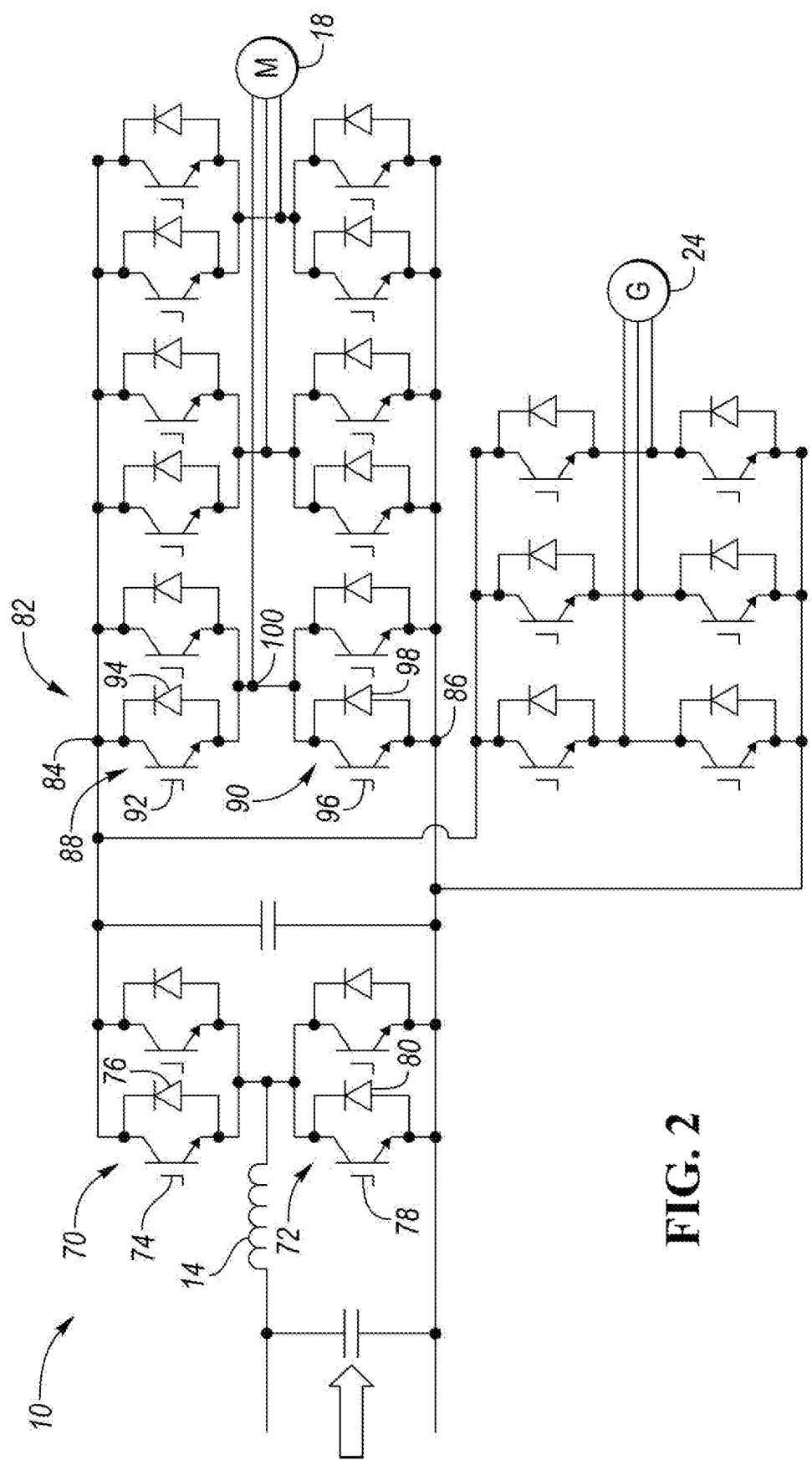
FIG. 2 is a schematic diagram of a variable-voltage converter and a power inverter.

Referring to FIG. 2, an electrical schematic of the VVC 10 and the inverter 56 is shown. The VVC 10 may include a one or more power stages having a transistor-based switching arrangement, such as a half bridge. Each power stage includes a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The inverter 56 may include a plurality of power stages having a transistor-based switching arrangement, such as one or more half-bridges that are stacked in an assembly. Each of the half bridges may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in anti-parallel to a first diode 94. The second switching unit 90 may include a second transistor 96 connected in anti-parallel to a second diode 98. The first and second transistors 92, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24.

In the illustrated embodiment, the VVC 10 includes two power stages and the inverter includes 9 power stages (three for the generator 24 and six for the motor 18). In other embodiments, the VVC 10 includes one power stage and the inverter includes six power stages (three for the generator 24 and three for the motor 18). The VVC power stages and the inverter power stages may be identical components and generally referred to as power stages. Both the VVC power stages and the inverter power stages may be arranged in a common stack.

FIGS. 3 to 9 and the related discussion describe example power-module assemblies and their individual components. The power-module assemblies may be for a power inverter, such as power inverter 56 described above, or may be for another type of power electronics.

Figure 3:
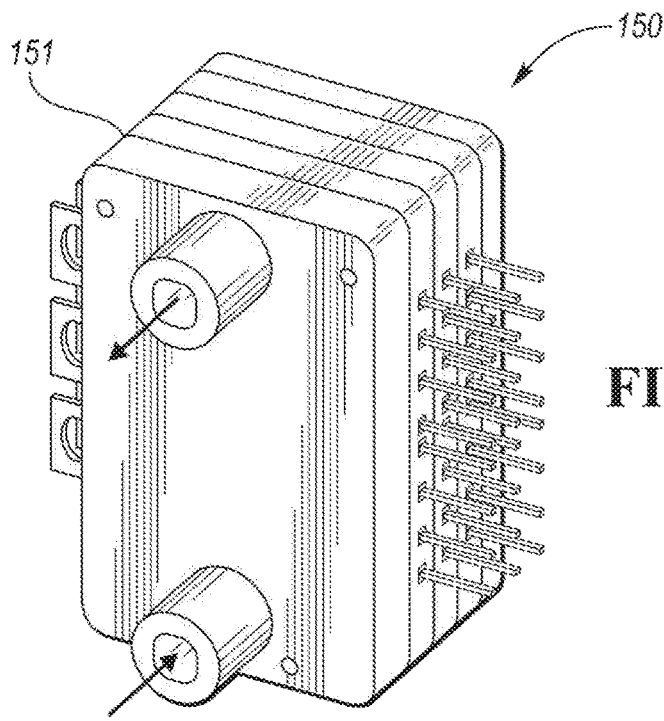
FIG. 3 is a perspective view of a power-module assembly.
Figure 4:
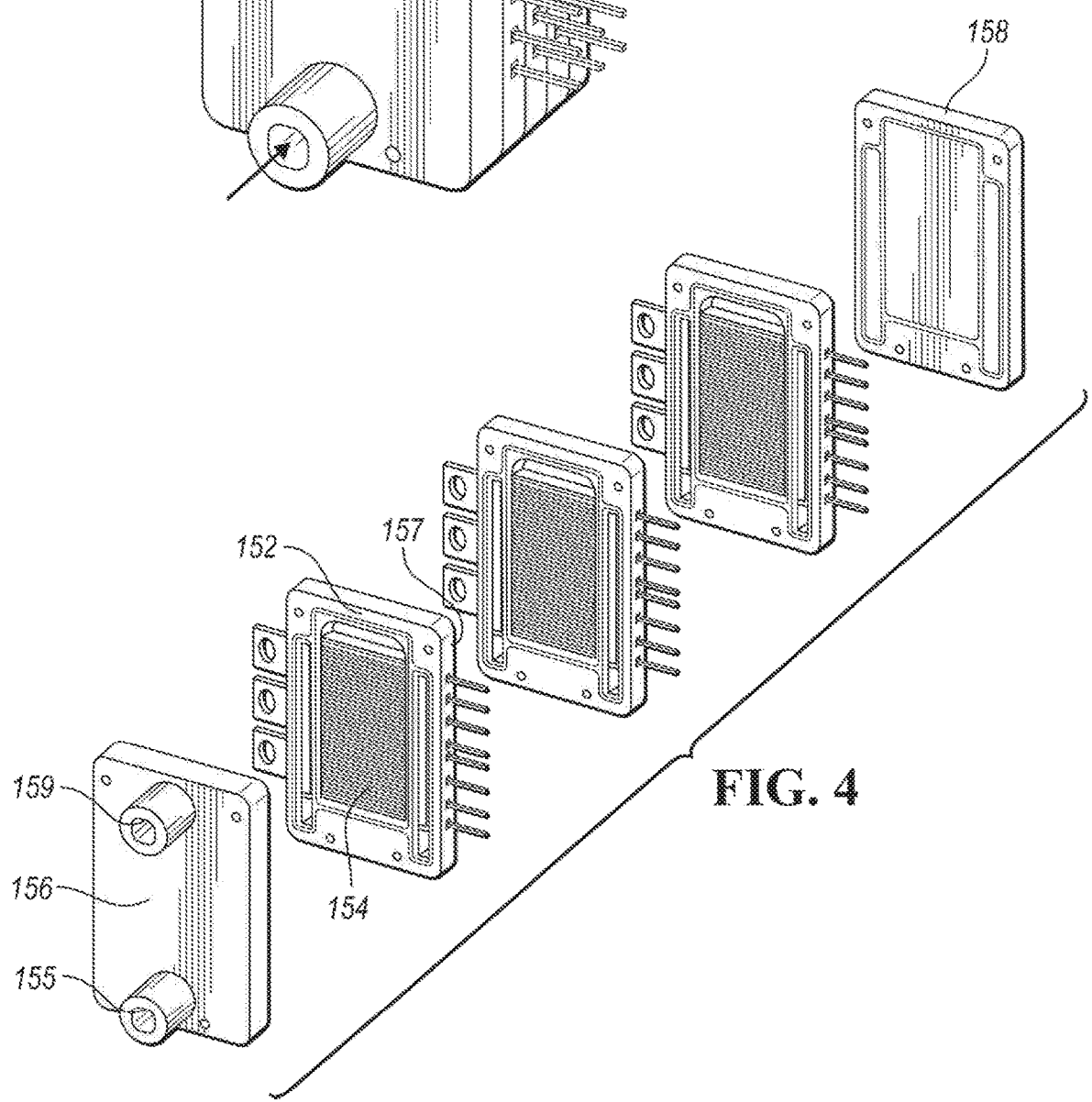
FIG. 4 is an exploded perspective view of the power-module assembly.

Referring to FIGS. 3 and 4, a power-module assembly 150 may be formed as a stack (array) 151 of power modules (unit cells) 152. The illustrated embodiment shows a stack of three power modules 152, however, this is just an example and more or less modules 152 may be included in the stack 151. Each power module 152 includes a power stage 154 and a frame 157. The power stage and the frame may be separate components or may be are integrally formed by a molding process. The power-module assembly 150 also includes a front cover 156 and a back cover plate 158. The front cover 156 includes a coolant inlet port 155 and a coolant outlet port 159. The inlet and outlet ports 155 and 159 are in fluid communication with channels defined within the stack. The channels may be microchannels. Used herein, a "microchannel" is a channel with a hydraulic diameter below 1 millimeter (mm). During operation, the coolant is circulated across the power modules 152 to cool the switching arrangements. This will be described in more detail below.

Figure 5:
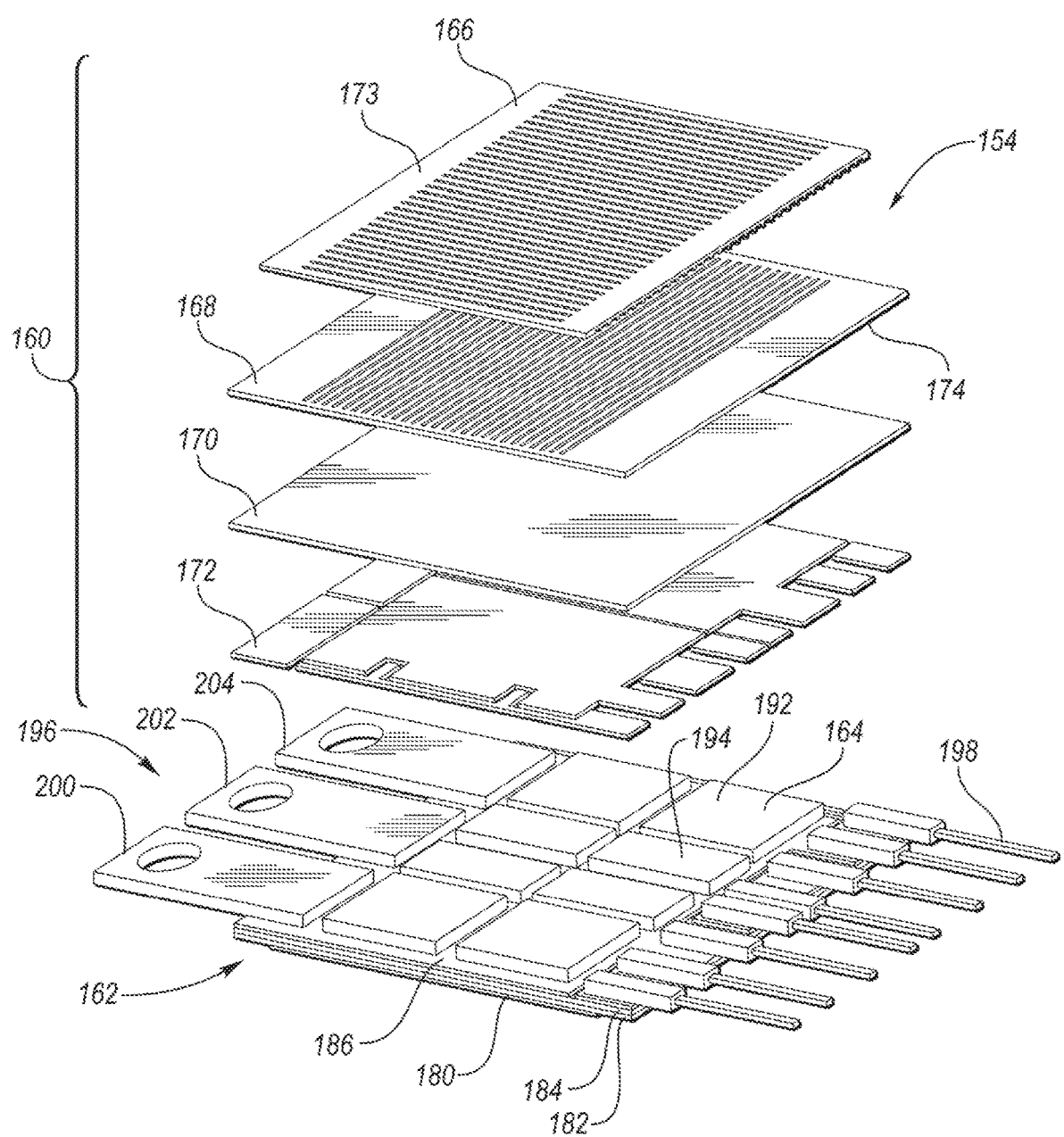
FIG. 5 is an exploded perspective view of a power stage of the power-module assembly.

Referring to FIG. 5, each power stage 154 may include a first substrate 160 and a second substrate 162 that sandwich a plurality of switching units 164. The first substrate 160 includes an outer plate 166, an interior plate 168, a dielectric layer (insulator) 170, and an inner plate 172. The outer plate 166 defines an outer major side 173 of the power stage 154, the inner plate 172 defines an inner major side of the substrate 160, and the thin edges of the plates and dielectric layer collectively define a portion of the minor sides 174 of the substrate 160. In other embodiments, the plates 166 and 168 may be a single plate.

The first substrate 160 may be a direct-bonded cooper (DBC) substrate. The plates and the dielectric layer may be bonded together by a high-temperature oxidation process for example. The plates 166, 168, 172 may be metal such as copper, aluminum, silver, or gold. In one embodiment, the inner plate 172 may be patterned copper. The term "patterned" refers to a plate that has been etched to define an electrical circuit. The dielectric layer 170 may be ceramic. Example ceramics include alumina, aluminum nitride, and silicon nitride. In some embodiments, the ceramics may be doped.

The second substrate 162 also includes an outer plate 180, an interior plate 182, a dielectric layer 184, and an inner plate 186. The materials of the plates and the dielectric layer maybe similar to that described above with respect to the first substrate 160. The second substrate 162 may be DBC.

In the illustrated embodiment, the power stage 154 includes four switching units 164. Each of the switching units 164 may include a transistor 192 and a diode 194, but other configuration are contemplated. The transistor 192 may be, but is not limited to, IGBTs or FETs. Each of the switching units 164 is electrically connected to one or both of the inner plate 172 and/or the inner plate 186. The power stage 154 may include a plurality of shims (not shown) that electrically connect the switching units 164 to one of the inner plates and act as spacing features. A mold compound may encapsulate the internal components of the power stage 154.

The power stage 154 also includes a plurality of terminals 196 and signal pins 198. For example, the power stage 154 may include a positive DC terminal 200, a negative DC terminal 202 and an AC terminal 204. The DC terminals 200, 202 are electrically connected with a capacitor bank of the inverter 56 and a traction battery. The AC terminal 204 is electrically connected to an associated electric machine. The signal pins 198 are electrically connected to a gate drive board of the inverter 56. The terminals and pins may be formed by a patterned inner plate or may be separate components attached to the switching units 164.

One or more of the substrates 160 and 162 may include a network of channels or microchannels configured to circulate coolant to thermally regulate the power stage 154. In the illustrated embodiment, both of the substrates 160 and 162 have microchannels. The microchannels may be defined in the outer plate and the interior plate of the substrate.

Figure 6:
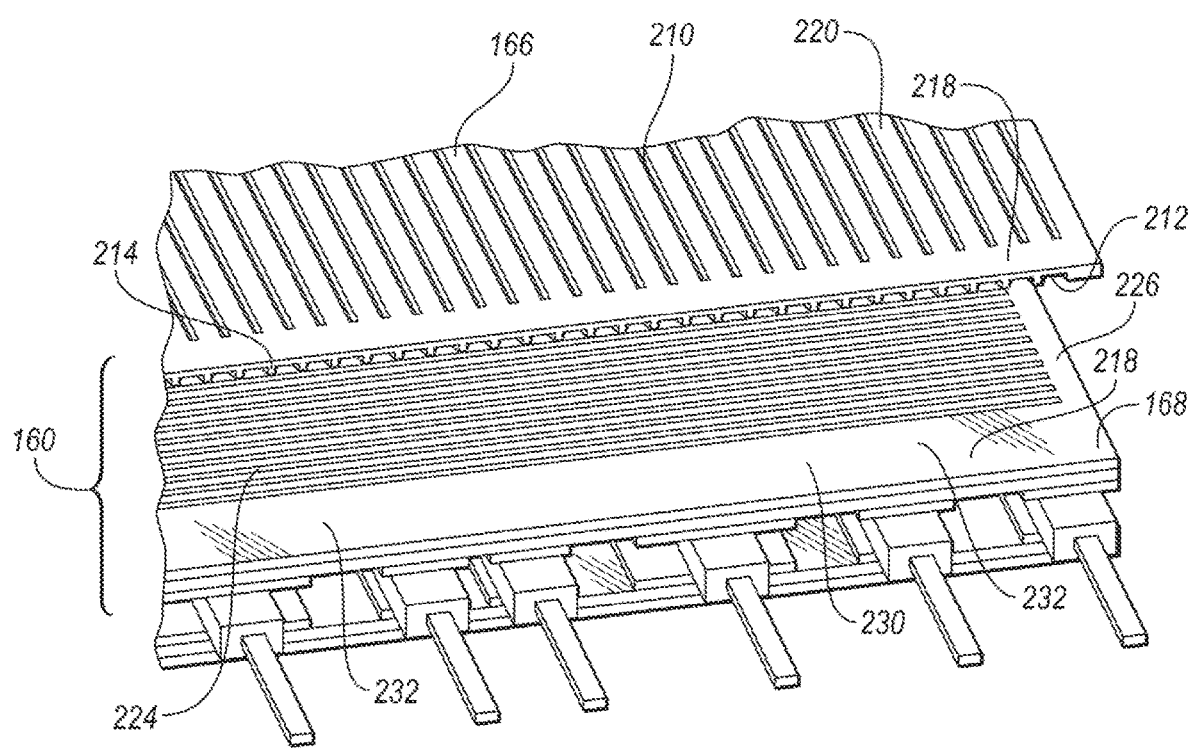
FIG. 6 is a partial exploded perspective view of the power stage.
Figure 7A:
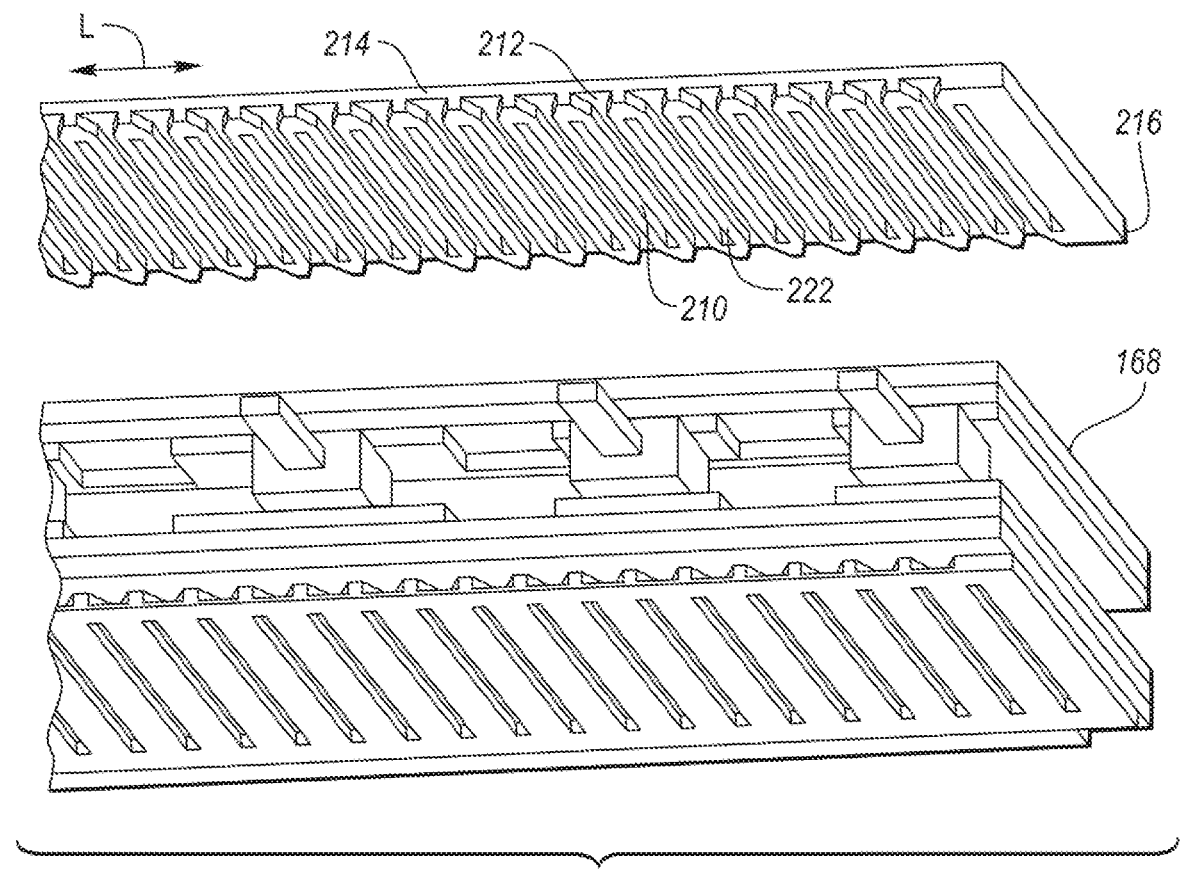
FIG. 7A is another partial exploded perspective view of the power stage.
Figure 7B:
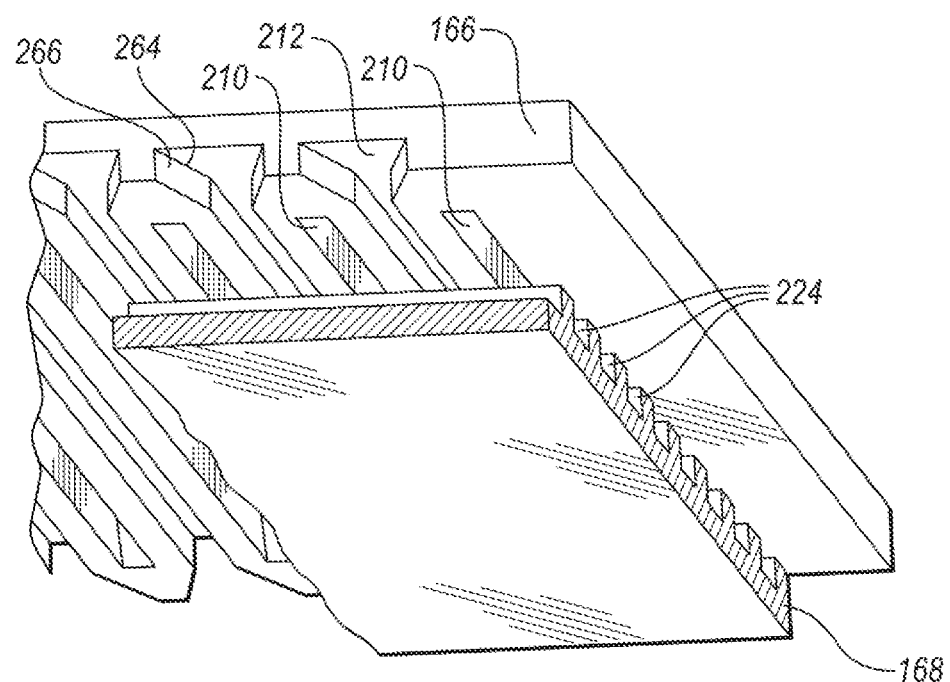
FIG. 7B is a detail view of a substrate of the power stage.

Referring to FIGS. 6, 7A, and 7B, in the first substrate 160, the outer plate 166 defines first microchannels 210 and second microchannels 212. The microchannels 210 and 212 are oriented to extend between opposing sides 214 and 216. All of the microchannels 210 may be parallel or at least substantially parallel with each other and all of the microchannels 212 may be parallel or at least substantially parallel with each other. The microchannels 210 and 212 may also be parallel or at least substantially parallel with each other. Used herein, "substantially parallel" means within plus or minus 3 degrees of parallel. The microchannels 210 may not completely extend axially between the opposing sides 214, 216 to form a border 218 on the front side 220 of the outer plate 166 whereas the microchannels 212 may completely extend between the opposing sides 214, 216. The microchannels 210 may be slots that extend completely through the thickness of the outer plate 166 so that fluid can flow from the backside 222 to the front side 220. The microchannels 212 may be recessed into the backside 222 and do not extend completely through the thickness of the outer plate 166. The microchannels 212 are placed between the microchannels 210 so that the channels 210 and 212 alternate in the lengthwise direction (L) of the plate.

The interior plate 168 defines third microchannels 224 oriented to crisscross with the first and second microchannels 210, 212. In some embodiments, the third microchannels 224 may be orthogonal or substantially orthogonal to the microchannels 210, 212. For example, the microchannels 224 may extend between a top 226 and a bottom (not shown) of the interior plate 168. All of the third microchannels 224 may be parallel or substantially parallel with each other. The third microchannels 224 are recessed into a front side 230 of the interior plate 168. The third microchannels 224 may only be arranged over a footprint of the switching arrangement 164. This creates a border 232 along the sides and top and bottom of the interior plate 168. The outer plate 166 may be smaller, e.g., narrower, than the interior plate 168 so that a portion of the border 232 (especially the side borders) is exposed.

The second substrate 162 may have the same microchannels arrangement as the first substrate 160. Briefly, the second substrate 162 may include first microchannels 234 that are the same or similar to the microchannels 210, second microchannels 236 that are the same or similar to the microchannels 212, and third microchannels (not visible) that are the same or similar to the microchannels 224. The illustrated embodiment is merely an exemplary embodiment is not limiting.

Figure 8:
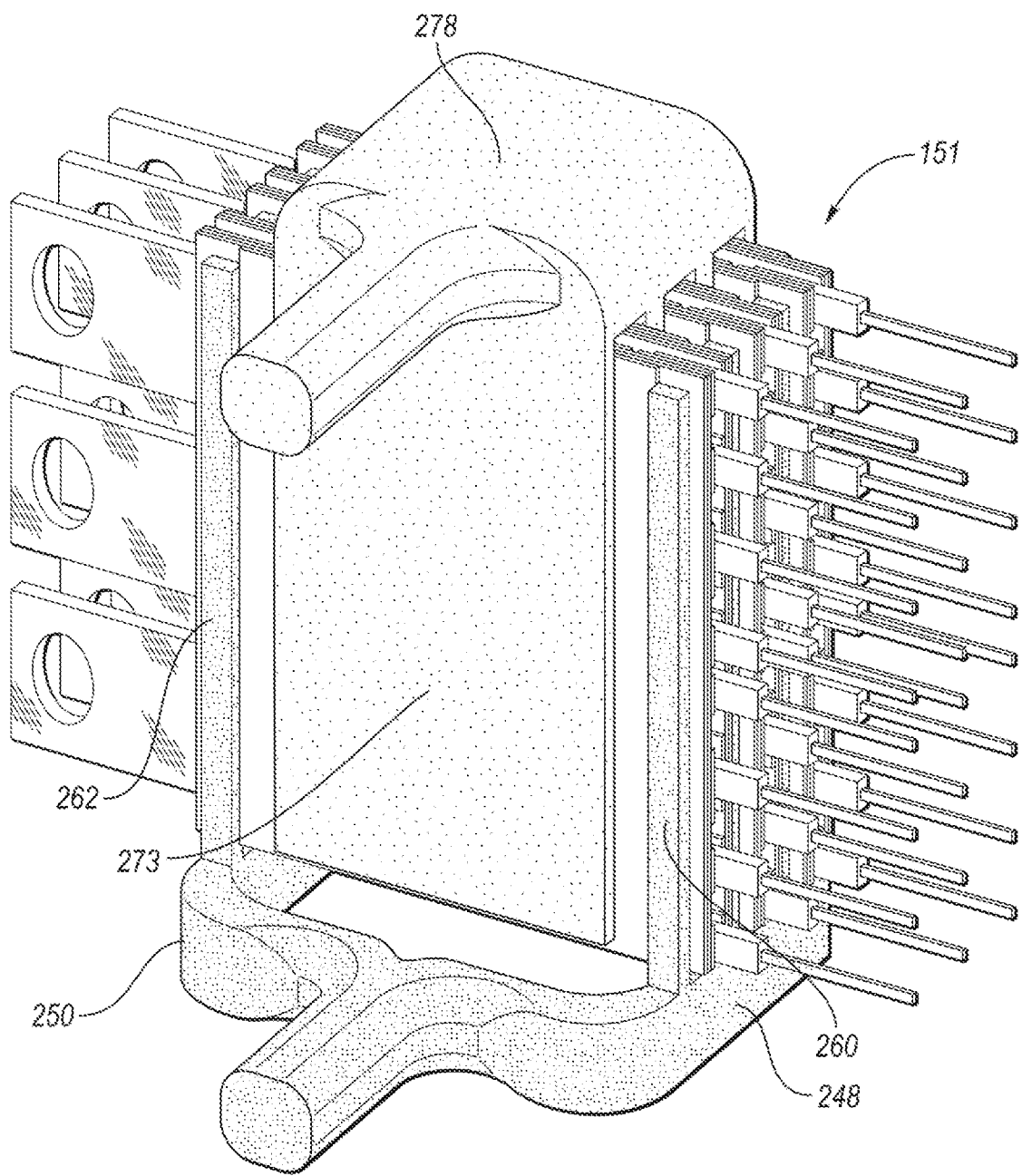
FIG. 8 is a schematic representation of an example coolant circuit of the power-module assembly showing the power stages and a solid representation of the coolant circuit.
Figure 9:
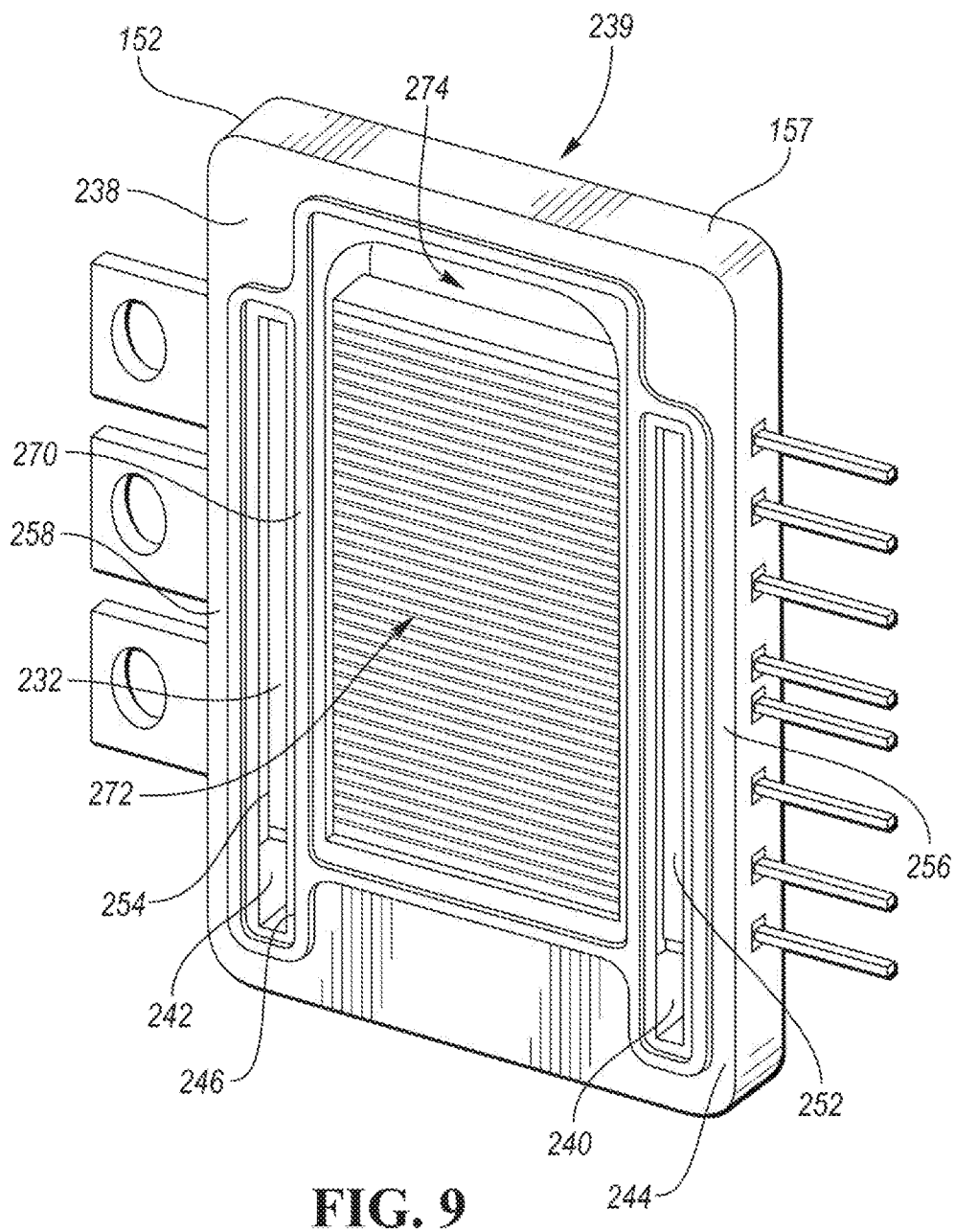
FIG. 9 is a perspective view of a power module of the power-module assembly.

Referring to FIGS. 7B, 8, and 9, each power module 152 includes opposing major sides 238 and 239. The frame 157 defines openings 240 and 242 in the lower sides 244, 246 that extend between the opposing major sides 238, 239 (i.e., openings 240, 242 extend through the thickness of the frame 157). The frame 157 also defines slots 252, 254 extending along the sides 256, 258. The slots may be formed on only one of the major sides or on both major sides. That is, each power module 152 may include two slots or four slots (illustrated embodiment). The slots 252, 254 are recessed into the frame 157 such that the borders 232 of the substrate are exposed to receive coolant. The frames 157 include spacing features 270 that form pockets 272 recessed into one or more of the major sides 238 and 239. In the illustrated embodiment, each power module 152 includes a pocket 272 on each major side. The pockets 272 are located over the power stage 154. The front/back boundaries of the pockets 272 are formed by the outer plates of the substrates 160 or 162. That is, for each power module 152, the outer plate 166 forms a boundary of one of the pockets 272 and the outer plate 180 forms the boundary of the other one of the pockets 272. The pockets 272 are continuous with the openings 274 defined in the top 276 of the frames 157.

As discussed above, a plurality of the power modules 152 are stacked together to form the power-module assembly 150. When stacked, the openings 240, 242, the slots 252, 254, the pockets 272, and the openings 274 of adjacent power modules cooperate (come together) to define portions of a coolant circuit. The pockets 272 cooperate to form coolant chambers 273 interleaved with the power stages 154 along the length of the power-module assembly 150. The coolant chambers 273 open into a return manifold 278 that is defined by the openings 274. The coolant-return manifold 278 is in fluid communication with the outlet port 159.

The slots 252, 254 of adjacent power modules 152 cooperate to form a plurality of coolant-supply headers 260, 262 that are also interleaved with the power stages 154. In the illustrated embodiment, each power module 152 has four associated coolant supply headers with two of the supply headers supplying coolant to the first substrate 160 and the other two supply headers supplying coolant to the second substrate 162. The supply headers push coolant into the power stage 154 from both sides. Coolant supply manifolds 248 and 250 are formed by the openings 240, 242 and extend along the length of the stack 151. The coolant-supply manifolds 248, 250 are disposed on opposite sides of the stack 151 with the power stages 154 generally being disposed therebetween. Each of the coolant-supply headers 260, 262 opens into one of the manifolds 248, 250. That is, the left bank of coolant headers is fed by the left coolant-supply manifold 250 and the right bank of coolant headers is fed by the right coolant supply manifold 248. The coolant-supply manifolds 248, 250 are in fluid communication with the inlet port 155.

During operation, coolant (such as ethylene glycol) is circulated from the supply manifolds 248, 250, to the supply headers 260, 262, and into the microchannels 212. Each of the microchannels 212 may be in fluid communication with both of the supply manifold 248, 250 via respective coolant-supply headers 260, 262. For example, each of the microchannels 212 may include an edge opening (entrance hole) 264 that opens into one of the headers 260, 262. The edge openings 264 may include slanted sides 266 to facilitate the flow of coolant from the supply headers into the microchannels 212. In the illustrated embodiment, the supply manifolds and headers are located on both sides of the stack 151 and coolant is pushed into both ends of the microchannels 212. The coolant in the microchannels 212 flows in a crosswise direction (C) of the power stage 154 to distribute the coolant over the major side(s) 238, 239 of the power module 152 and flows inwardly from the microchannels 212 into the microchannels 224 of the interior plate 168. The microchannels 224, which may be orthogonal, circulate the coolant in the lengthwise direction (L) to convey the fluid to the microchannels 210. The coolant then flows outwardly through the open microchannels 210 allowing the fluid to pass through the outer plate and into the coolant chamber 273. Coolant exiting the microchannels 212 pool in the chambers 273 and flow upwardly into the return manifold 278. From there, the coolant circulates out of the system via the outlet port 159.

The second substrates 162, if proved with microchannels, are also in fluid communication with corresponding coolant headers 260, 262 and may circulate coolant in a same or similar manner to that described above.

Figure 10:
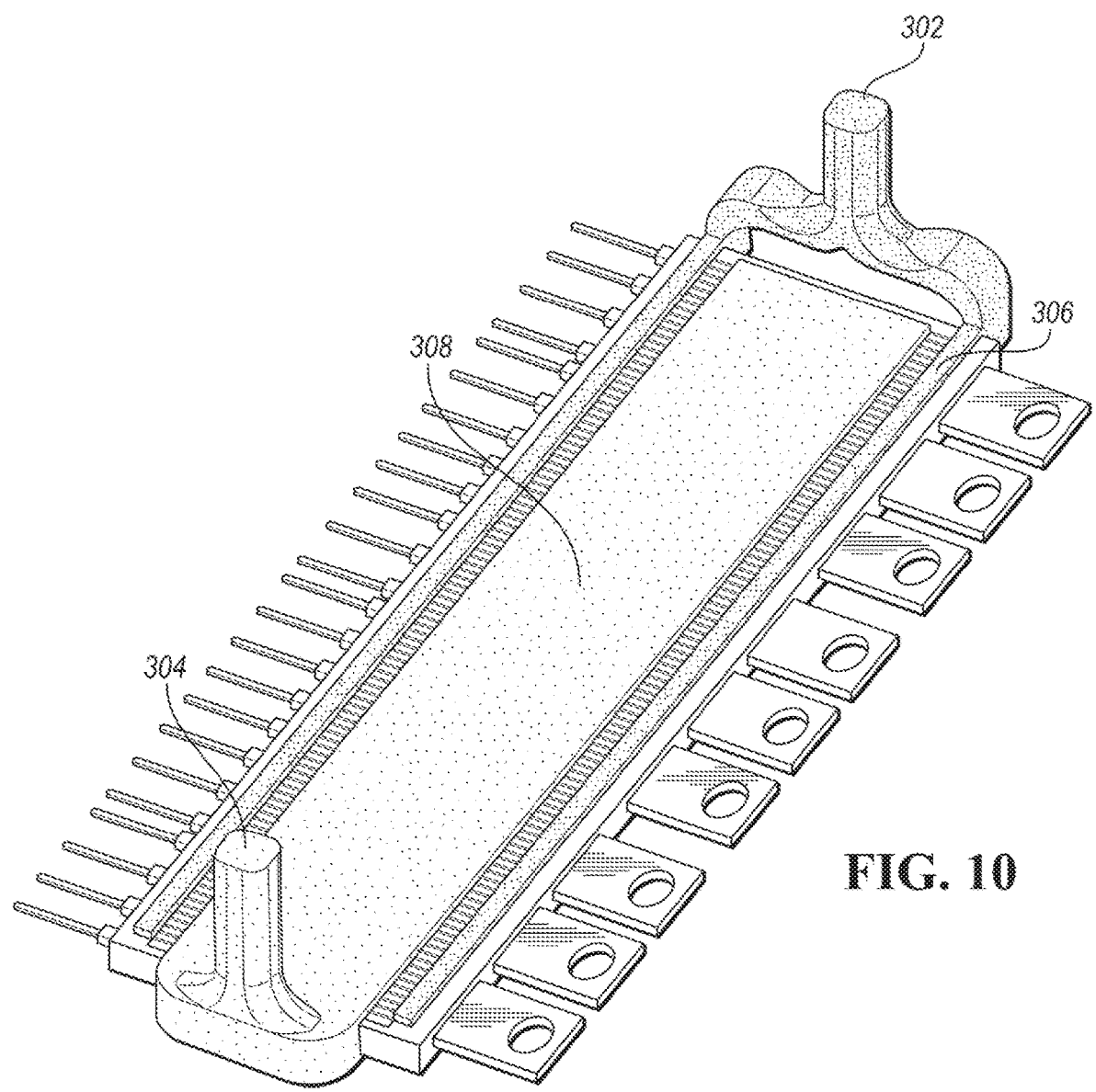
FIG. 10 is a schematic representation of another power-module assembly.

Referring to FIG. 10, a planar arrangement of power stages is shown. In the power module assembly 300, the power stages 154 are places end-to-end to be coplanar. The structure of the microchannels and the power stages may the same as above. The power module assembly 300 includes a supply port 302 and a return port 304. Supply headers 306 feed the microchannels similar to above. Coolant flows through the microchannels and collects in the coolant chamber(s) 308, which may be on one or both sides. Unlike above, the coolant chamber 308 is continuous with multiple power stages. The coolant chamber(s) 308 are in fluid communication with the outlet port 304 to recirculate the coolant.

The above-described power-module assemblies each has a three-dimensional flow path through the substrate-embedded microchannels that provided increased surface area and highly turbulent flow to more efficiently cool the assembly 150. The flow path also has a lower pressure drop that requires less pumping power. These improvements cooperate to reduce the temperature differential of the system and improve overall cooling performance among other things.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power-module assembly comprising:
a plurality of power modules each including a power stage having a substrate and a transistor-based switching arrangement supported on the substrate, the power modules being arranged in a stack that defines coolant chambers interleaved with the power stages and defines a pair of coolant-supply manifolds disposed on opposing sides of the stack and extending along a length of the stack, wherein, for each power module, the substrate defines a network of cooling channels connecting the supply manifolds to a corresponding one of the chambers, the network including first channels each configured to receive coolant from the pair of coolant-supply manifolds, second channels substantially parallel to the first channels and each opening into the corresponding one of the chambers, and third channels crisscrossing the first and second channels to connect the first and second channels in fluid communication.

2. The power-module assembly of claim 1, wherein the third channels are orthogonal to the first and second channels.

3. The power-module assembly of claim 1, wherein, for each of power modules, the substrate includes an outer plate forming a boundary of the corresponding one of the chambers and defining the first and second channels and includes an interior plate disposed against the outer plate and defining the third channels.

4. The power-module assembly of claim 3, wherein the outer plate includes a front that forms the boundary and a back that is disposed against a front of the interior plate, wherein the first channels are recessed into the back, the second channels extend from the front to the back to be completely through a thickness of the outer plate, and the third channels are recessed into the front of the interior plate.

5. The power-module assembly of claim 4, wherein the outer plate and the interior plate are formed of copper alloy.

6. The power-module assembly of claim 1, wherein, for each power-module assembly, the substrate includes opposing edges, and the first channels extend fully between the opposing edges and the second channels extend partially between the opposing edges.

7. The power-module assembly of claim 1, wherein the stack defines a coolant-return manifold connecting the chambers in fluid communication.

8. The power-module assembly of claim 1, wherein each of the power modules further includes a frame having opposing sides that each define at least one coolant-supply header extending from an associated one of the coolant-supply manifolds, and wherein, for each power module, each of the first channels defines a first entrance hole opening into one of the headers and a second first entrance hole opening into another of the headers.

9. The power-module assembly of claim 1, wherein each of the power stages further includes a second substrate attached to the switching arrangement such that the substrate and the second substrate sandwich the switching arrangement.

10. The power-module assembly of claim 9, wherein the second substrate defines a second network of channels connecting the supply manifolds to a corresponding one of the chambers, the second network including fourth channels each configured to receive coolant from the pair of coolant-supply manifolds, fifth channels substantially parallel to the fourth channels and opening into the corresponding one of the chambers, and sixth channels crisscrossing the fourth and fifth channels to connect the fourth and fifth channels in fluid communication.

11. A power-module assembly comprising:
a plurality of power modules each including a power stage and a frame defining a pocket adjacent to the power stage and slots disposed on opposing sides of the power stage, wherein the power modules are stacked in an array such that pockets adjacent to each other form coolant chambers interleaved with the power stages and such that slots adjacent to each other form coolant headers, wherein each of the power stages has at least one substrate including:
   first channels each configured to receive coolant from an associated pair of coolant headers,
   second channels substantially parallel to the first channels and each opening into a corresponding one of the coolant chambers to provide coolant thereto, and
   third channels crisscrossing the first and second channels to connect the first and second channels in fluid communication.

12. The power-module assembly of claim 11, wherein the array defines a coolant inlet port in fluid communication with each of the headers.

13. The power-module assembly of claim 12, wherein the array defines a pair of coolant-supply manifolds, wherein each of the headers includes a first end that opens into one of the coolant-supply manifolds.

14. The power-module assembly of claim 12, wherein the third channels are orthogonal to the first and second channels.

15. The power-module assembly of claim 11, wherein, for each of the power modules, the substrate includes an outer plate defining the first and second channels and an interior plate disposed against the outer plate and defining the third channels.

16. A power-module assembly having a plurality of power modules arranged in a stack, each power module comprising:
a frame; and
a power stage supported in the frame, the power stage including a plurality of switches supported on a substrate and configured to transform direct current into alternating current, the substrate including:
   an outer plate having opposing first and second edges, the outer plate defining first microchannels recessed into a back of the outer plate and oriented to extend between the opposing edges and defining second microchannels completely through a thickness of the outer plate, oriented to extend between the opposing edges, and positioned between the first microchannels such that the first and second microchannels alternate along the outer plate, and
   an interior plate having a front disposed against the back of the outer plate and defining third microchannels recessed into the front and oriented to crisscross the first and second microchannels such that the third microchannels connect the first and second microchannels in fluid communication.

17. The power module of claim 16, wherein the third microchannels are orthogonal to the first and second microchannels.

18. The power module of claim 16, wherein the first microchannels extend fully between the opposing edges and the second microchannels extend partially between the opposing edges.

19. The power module of claim 16, wherein the substrate is a direct-bonded copper substrate in which the outer plate and the interior plate are formed of copper.

20. The power module of claim 16, wherein the substrate further includes:
   an inner plate disposed against the switches, and
   an insulator sandwiched between the inner plate and the interior plate.

* * * * *